US007902748B2

(12) United States Patent
Cok (10) Patent No.: US 7,902,748 B2
(45) Date of Patent: *Mar. 8, 2011

(54) ELECTROLUMINESCENT DEVICE HAVING IMPROVED LIGHT OUTPUT (75) Inventor: Ronald S. Cok, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 364 days.

This patent is subject to a terminal disclaimer.

(21) Appl. No.: 11/756,063

(22) Filed: May 31, 2007

(65) Prior Publication Data
US 2008/0297029 A1 Dec. 4, 2008

(51) Int. Cl.
H01J 1/62 (2006.01)

(52) U.S. Cl. .......................... 313/506; 313/509; 313/512

(58) Field of Classification Search ........... 313/498–512
See application file for complete search history.

(56) References Cited

U.S. PATENT DOCUMENTS

| 4,476,292 | A | * | 10/1984 | Ham et al. ....................... 528/60 |
| 4,769,292 | A | | 9/1988 | Tang et al. |
| 4,796,292 | A | * | 1/1989 | Thomas ..................... 379/91.01 |
| 5,247,190 | A | * | 9/1993 | Friend et al. ..................... 257/40 |
| 5,834,893 | A | | 11/1998 | Bulovic et al. ................. 313/506 |
| 5,955,837 | A | * | 9/1999 | Horikx et al. ................. 313/506 |
| 6,091,195 | A | * | 7/2000 | Forrest et al. ................. 313/504 |
| 6,144,429 | A | * | 11/2000 | Nakai et al. .................... 349/113 |
| 6,472,804 | B2 | * | 10/2002 | Mueller et al. ................ 313/326 |
| 6,777,871 | B2 | * | 8/2004 | Duggal et al. ................. 313/506 |
| 6,787,796 | B2 | * | 9/2004 | Do et al. .......................... 257/40 |
| 7,109,652 | B2 | * | 9/2006 | Tsai et al. ..................... 313/506 |
| 2001/0026124 | A1 | * | 10/2001 | Liu et al. ........................ 313/504 |
| 2002/0011783 | A1 | * | 1/2002 | Hosokawa ..................... 313/504 |
| 2002/0061418 | A1 | * | 5/2002 | Imanishi ........................ 428/690 |
| 2003/0071569 | A1 | * | 4/2003 | Chung et al. .................. 313/512 |
| 2003/0146453 | A1 | * | 8/2003 | Beck et al. ..................... 257/200 |
| 2003/0203551 | A1 | * | 10/2003 | Cok et al. ...................... 438/200 |
| 2003/0209972 | A1 | * | 11/2003 | Holmes et al. ................ 313/504 |

(Continued)

FOREIGN PATENT DOCUMENTS

WO 2002/037580 5/2002

(Continued)

OTHER PUBLICATIONS

Mueller et al., "Multicolor Light-Emitting Diodes Based on Semiconductor Nanocrystals Encapsulated in GaN Charge Injection Layers," Nano Letters 5, 1039, 2005.

(Continued)

Primary Examiner — Bumsuk Won
(74) Attorney, Agent, or Firm — McKenna Long & Aldridge LLP (57) ABSTRACT An electroluminescent (EL) device that includes a light-emitting area formed over a substrate. First and second electrodes and one or more EL unit(s) are included along with at least one light-emitting layer formed between the electrodes, wherein at least one electrode is transparent. A cover is located over the light-emitting area, and a light-scattering layer is located between the substrate and cover. The light-scattering layer includes transparent, light-scattering particles, wherein the ratio of the volume of light-scattering particles to the volume of the light-scattering layer is greater than 0.55 over a majority of the light-emitting area, wherein either the substrate or cover is transparent and transmits light emitted from the EL unit(s).

17 Claims, 7 Drawing Sheets

U.S. PATENT DOCUMENTS

| | | | |
|---|---|---|---|
| 2004/0031977 A1* | 2/2004 | Brown et al. | 257/222 |
| 2004/0061136 A1* | 4/2004 | Tyan et al. | 257/200 |
| 2004/0119400 A1* | 6/2004 | Takahashi et al. | 313/504 |
| 2004/0217702 A1* | 11/2004 | Garner et al. | 313/512 |
| 2005/0007000 A1* | 1/2005 | Chou et al. | 313/116 |
| 2005/0018431 A1* | 1/2005 | Shiang | 362/326 |
| 2005/0127378 A1* | 6/2005 | Suehiro et al. | 257/81 |
| 2005/0142379 A1* | 6/2005 | Juni et al. | 428/690 |
| 2005/0194896 A1* | 9/2005 | Sugita et al. | 313/506 |
| 2006/0068154 A1* | 3/2006 | Parce et al. | 428/76 |
| 2006/0087489 A1* | 4/2006 | Sakurai et al. | 345/107 |
| 2006/0186802 A1 | 8/2006 | Cok et al. | |
| 2007/0057263 A1 | 3/2007 | Kahen | |
| 2007/0257608 A1* | 11/2007 | Tyan et al. | 313/506 |
| 2008/0084150 A1 | 4/2008 | Cok | |

FOREIGN PATENT DOCUMENTS

| | | |
|---|---|---|
| WO | 2006/040704 | 4/2006 |

OTHER PUBLICATIONS

Coe et al., "Electroluminescence from single monolayers of nanocrystals in molecular organic devices," Nature 420, 800, 2002.

Hikmet et al., "Study of conduction mechanism and electroluminescence in CdSe/ZnS quantum dot composites," Journal of Applied Physics, vol. 93, No. 6, pp. 3509-3514, Mar. 2003.

Matoussi et al., "Electroluminescence from heterostructures of poly(phenylene vinylene) and inorganic CdSe nanocrystals," Journal of Applied Physics, vol. 83, No. 12, pp. 7965-7974, Jun. 1998.

Tang et al., "Organic electroluminescent diodes," Applied Physics Letters, 51, vol. 12, pp. 913-915, Sep. 1987.

Tang et al., "Electroluminescence of doped organic thin films," Journal of Applied Physics, 65, 9, pp. 3610-3616, May 1989.

* cited by examiner

ELECTROLUMINESCENT DEVICE HAVING IMPROVED LIGHT OUTPUT

FIELD OF THE INVENTION

The present invention relates to electroluminescent (EL) light-emitting diode (LED) devices, and more particularly, to electroluminescent device structures having a light-scattering layer for improving light output.

BACKGROUND OF THE INVENTION

Electroluminescent devices are a promising technology for flat-panel displays and area illumination lamps. These devices rely upon thin-film layers of materials coated upon a substrate, and include organic, inorganic and hybrid inorganic-organic light-emitting diodes. The thin-film layers of materials can include, for example, organic materials, quantum dots, fused inorganic nano-particles, electrodes, conductors, and silicon electronic components as are known and taught in the LED art.

Irrespective of the particular electroluminescent device configuration tailored to these broad fields of applications, all electroluminescent devices function on the same general principles. An electroluminescent (EL) unit is sandwiched between two electrodes. At least one of the electrodes is at least partially light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the LED is said to be forward-biased. Positive charge carriers (holes) are injected from the anode into the EL unit, and negative charge carriers (electrons) are injected from the cathode. Such charge carrier injection causes current flow from the electrodes through the EL unit. Recombination of holes and electrons occurs within the light-emitting layer and results in emission of light. For example, electroluminescent devices containing quantum dot light-emitting diode (LED) structures can be either inorganic or hybrid inorganic-organic, and the recombination of the holes and electrons occurs within the core of a quantum dot in the light-emitting layer. A hybrid inorganic-organic EL unit can be formed of a stack of sub-layers that can include small-molecule layers or polymer layers.

In the late 1990's LED devices containing mixed emitters of organics and quantum dots were introduced (Mattoussi et al., Journal of Applied Physics 83, 7965 (1998)). Quantum dots are light-emitting, nano-sized, semiconductor crystals. Adding quantum dots to the emitter layers could enhance the color gamut of the device; red, green, and blue emission could be obtained by simply varying the quantum-dot particle size; and the manufacturing cost could be reduced. Because of problems such as aggregation of the quantum dots in the emitter layer, the efficiency of these devices was rather low in comparison with typical OLED devices. The efficiency was even poorer when a neat film of quantum dots was used as the emitter layer (Hikmet et al., Journal of Applied Physics 93, 3509 (2003)). The poor efficiency was attributed to the insulating nature of the quantum-dot layer. Later the efficiency was boosted (to ~1.5 cd/A) upon depositing a mono-layer film of quantum dots between organic hole and electron transport layers (Coe et al., Nature 420, 800 (2002)). It was stated that luminescence from the quantum dots occurred mainly as a result of Forster energy transfer from excitons on the organic molecules (electron-hole recombination occurs on the organic molecules). Regardless of improvements in efficiency, these hybrid devices still suffer from all of the drawbacks associated with pure OLED devices.

Recently, a mainly all-inorganic LED was constructed (Mueller et al., Nano Letters 5, 1039 (2005)) by sandwiching a monolayer thick core/shell CdSe/ZnS quantum-dot layer between vacuum deposited inorganic n- and p-GaN layers. The resulting device had a poor external quantum efficiency of 0.001 to 0.01%. Part of that problem could be associated with the organic ligands of trioctylphosphine oxide (TOPO) and trioctylphosphine (TOP) that were reported to be present post growth. These organic ligands are insulators and would result in poor electron and hole injection into the quantum dots.

As described in co-pending, commonly assigned US Publication 2007/0057263 by Kahen, which is hereby incorporated by reference in its entirety, additional semiconductor nanoparticles may be provided with the quantum dots in a layer to enhance the conductivity of the light-emitting layer.

OLED devices generally can have two formats known as small molecule devices, such as disclosed in U.S. Pat. No. 4,476,292, and polymer OLED devices such as disclosed in U.S. Pat. No. 5,247,190. Either type of OLED device may include, in sequence, an anode, an organic EL element, and a cathode. In most designs, one of the electrodes is reflective and the other transparent. The organic EL element disposed between the anode and the cathode commonly includes an organic hole-transporting layer (HTL), a light-emissive layer (LEL), and an organic electron-transporting layer (ETL). Holes and electrons recombine and emit light in the LEL layer. Tang et al. (Applied Physics Letters, 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an LED device when electrons and holes that are injected from the cathode and anode, respectively, flow through the respective charge-transport layers and recombine in the emissive layer. Many factors determine the efficiency of this light-generating process. For example, the selection of anode and cathode materials can determine how efficiently the electrons and holes are injected into the device; the selection of ETL and HTL can determine how efficiently the electrons and holes are transported in the device, and the selection of LEL can determine how efficiently the electrons and holes are recombined and result in the emission of light, etc.

It has also been found, that one of the key factors that limits the efficiency of LED devices is the inefficiency in extracting the photons, generated by the electron-hole recombination, out of the LED devices. Due to the high optical indices of the materials used, most of the photons generated by the recombination process are actually trapped in the devices due to total internal reflection. These trapped photons never leave the LED devices and make no contribution to the light output from these devices. Because light is emitted in all directions from the internal layers of the LED, some of the light is emitted directly from the device, and some is emitted into the device and is either reflected back out or is absorbed, and some of the light is emitted laterally and trapped and absorbed by the various layers comprising the device. In general, up to 80% of the light may be lost in this manner.

A typical OLED device uses a glass substrate, a transparent conducting anode such as indium-tin-oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, and a top transparent cathode layer and transparent cover. Light generated from the device is emitted through the top transparent electrode and transparent cover. This is commonly referred to as a top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions.

Figure 8:
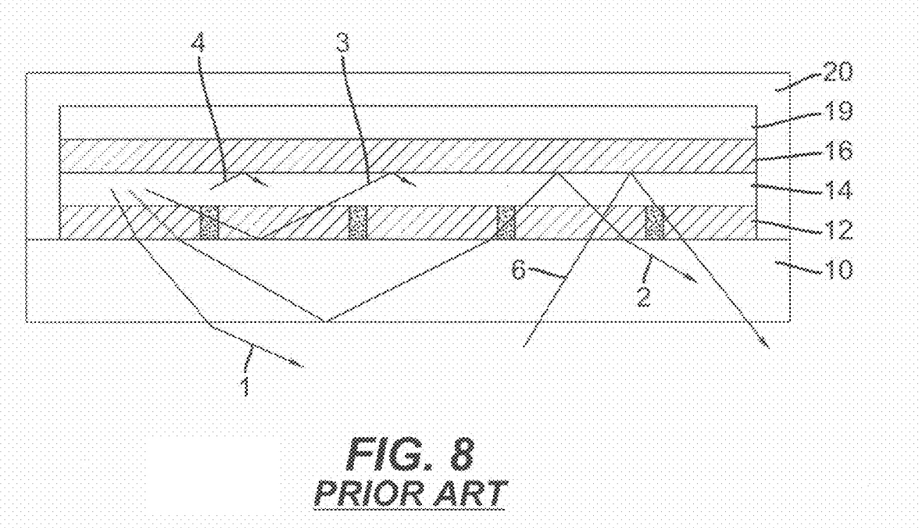
FIG. 8 illustrates a cross section of a prior-art bottom-emitter LED device having trapped light.

In any of these LED structures, the problem of trapped emitted light and reflected ambient light remains. Referring to FIG. 8, a bottom-emitting LED device as known in the prior art is illustrated having a transparent substrate 10, a transparent first electrode 12, an EL unit 14 which contains a light-emitting layer, a reflective second electrode 16, a gap 19 and a cover 20. The gap 19 is typically filled with desiccating material. Light emitted from the EL units 14 can be emitted directly out of the device, through the transparent substrate 10, as illustrated with light ray 1. Light may also be emitted and internally guided in the transparent substrate 10 and EL unit 14, as illustrated with light ray 2. Additionally, light may be emitted and internally guided in the EL unit 14, as illustrated with light ray 3. Light rays 4 emitted toward the reflective electrode 16 are reflected back toward the substrate 10 and follow one of the light ray paths 1, 2, or 3. Ambient light 6 incident on the LED may be reflected from the reflective electrode 16, thereby reducing the ambient contrast of the LED device. In some prior-art embodiments, the electrode 16 may be opaque and/or light absorbing. Such an arrangement will increase the contrast by absorbing ambient light, but also absorbs the light 4 emitted toward the electrode 16. The bottom-emitter embodiment shown may also be implemented in a top-emitter configuration with a transparent cover and top electrode 16.

A variety of techniques have been proposed to improve the out-coupling of light from thin-film light emitting devices. Such techniques include the use of diffraction gratings, brightness enhancement films having diffractive properties, reflective structures, and surface and volume diffusers. The use of micro-cavity techniques is also known. However, none of these approaches cause all, or nearly all, of the light produced to be emitted from the device. Moreover, diffractive techniques cause a significant frequency dependence on the angle of emission so that the color of the light emitted from the device changes with the viewer's perspective. Scattering techniques are also known and described in, for example, US 2006/0186802 entitled "OLED device having improved light output" by Cok, which is hereby incorporated by reference in its entirety.

US 2005/0007000 entitled, "Brightness and contrast enhancement of direct view emissive displays" describes emissive displays including a plurality of independently operable light emitters that emit light through one or more transmissive layers. The emissive displays further include elements disposed between the light emitters and the transmissive layers to frustrate total internal reflections that can occur at one or more of the interfaces created by the transmissive layers, such as at an interface between the light emitter and a transmissive layer or at an interface between a transmissive layer and air. By frustrating total internal reflections, the brightness of the emissive display can be enhanced. Elements for frustrating total internal reflections include volume diffusers, surface diffusers, microstructures, and combinations of these or other suitable elements.

Scattering techniques are known to assist in extracting light from LED devices. Chou (WO 02/37580) and Liu et al. (U.S. Publication No. 2001/0026124) taught the use of a volume or surface scattering layer to improve light extraction. The scattering layer is applied next to the organic layers or on the outside surface of the glass substrate and has an optical index that matches these layers. Light emitted from the OLED device at an angle higher than a critical angle, and would have otherwise been trapped can penetrate into the scattering layer and be scattered out of the device. The efficiency of the OLED device is thereby improved but still has deficiencies as explained below. Moreover, the contrast of the device is not improved under diffuse illumination.

U.S. Pat. No. 6,787,796 entitled "Organic electroluminescent display device and method of manufacturing the same" by Do et al issued Sep. 7, 2004, describes an organic electroluminescent (EL) display device and a method of manufacturing the same. The organic EL device includes a substrate layer, a first electrode layer formed on the substrate layer, an organic layer formed on the first electrode layer, and a second electrode layer formed on the organic layer, wherein a light-loss preventing layer having different refractive index areas is formed between layers of the organic EL device having a large difference in refractive index among the respective layers. U.S. Publication No. 2004/0217702 entitled "Light extracting designs for organic light emitting diodes" by Garner et al., similarly discloses use of microstructures to provide internal refractive index variations or internal or surface physical variations that function to perturb the propagation of internal waveguide modes within an OLED. When employed in a top-emitter embodiment, the use of an index-matched polymer adjacent the cover is disclosed.

Light-scattering layers used externally to an OLED device are described in U.S. Publication No. 2005/0018431 entitled "Organic electroluminescent devices having improved light extraction" by Shiang and U.S. Pat. No. 5,955,837 entitled "System with an active layer of a medium having light-scattering properties for flat-panel display devices" by Horikx, et al. These disclosures describe and define properties of scattering layers located on a substrate in detail. Likewise, U.S. Pat. No. 6,777,871 entitled "Organic ElectroLuminescent Devices with Enhanced Light Extraction" by Duggal et al., describes the use of an output coupler comprising a composite layer having specific refractive indices and scattering properties. While useful for extracting light, this approach will only extract light that propagates in the substrate (illustrated with light ray 2) and will not extract light that propagates through the organic layers and electrodes (illustrated with light ray 3).

Figure 9:
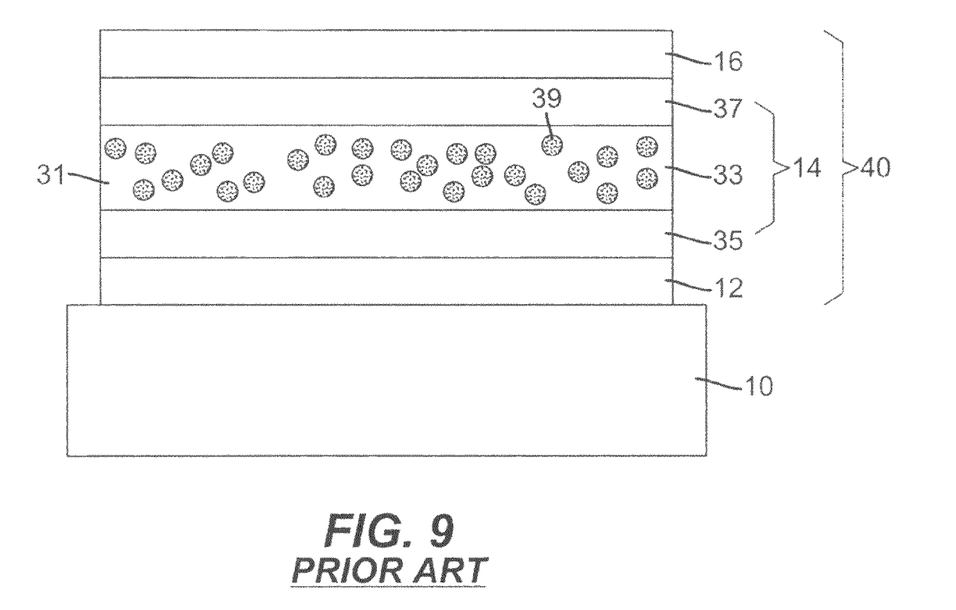
FIG. 9 illustrates a cross section of a prior-art bottom-emitter LED device having a scattering surface and reduced sharpness.

In any case, scattering techniques, by themselves, cause light to pass through the light-absorbing material layers multiple times where they are absorbed and converted to heat. Moreover, trapped light may propagate a considerable distance horizontally through the cover, substrate, or organic layers before being scattered out of the device, thereby reducing the sharpness of the device in pixellated applications such as displays. For example, as illustrated in FIG. 9, a prior-art pixellated bottom-emitting LED device may include a plurality of independently controlled sub-pixels 50, 52, 54, 56, and 58 and a scattering layer 22 located between the transparent first electrode 12 and the substrate 10. A light ray 5 emitted from the light-emitting layer may be scattered multiple times by scattering layer 22, while traveling through the substrate 10, EL unit(s) 14, and transparent first electrode 12 before it is emitted from the device. When the light ray 5 is finally emitted from the device, the light ray 5 has traveled a considerable distance through the various device layers from the original sub-pixel 50 location where it originated to a remote sub-pixel 58 where it is emitted, thus reducing sharpness. Most of the lateral travel occurs in the substrate 10, because that is by far the thickest layer in the package. Also, the amount of light emitted is reduced due to absorption of light in the various layers.

U.S. Publication No. 2004/0061136 entitled "Organic light emitting device having enhanced light extraction efficiency" by Tyan et al., describes an enhanced light-extraction OLED device that includes a light-scattering layer. In certain embodiments, a low-index isolation layer (having an optical index substantially lower than that of the organic electroluminescent element) is employed adjacent to a reflective layer in combination with the light-scattering layer to prevent low-angle light from striking the reflective layer, and thereby minimize absorption losses due to multiple reflections from the reflective layer. The particular arrangements, however, may still result in reduced sharpness of the device and does not improve contrast.

It is known to improve the contrast of a LED device by employing, for example, black-matrix materials between the light-emitting areas or by using color filters. While such methods are useful, the presence of a reflective electrode still decreases the ambient contrast significantly. As noted above, circular polarizers may be employed, but Applicants have determined that light-extraction techniques such as scattering layers tend to be incompatible with such polarizers.

As taught in the prior art, classic scattering theory employs arrays of spheres. If such spheres are arranged adjacent to each other to form a layer, the ratio of the volume of the spheres ($V_p=(4*\pi*r^3)/3$) divided by the volume of the layer ($V_L=(2*r)^3$) is equal to $\pi/6$ or 0.5236. U.S. Pat. No. 5,955,837, entitled, "Electroluminescent illumination system with an active layer of a medium having light-scattering properties for flat-panel display devices" describes the use of a half-monolayer of scattering particles on the substrate of a bottom-emitting electro-luminescent device. The volume ratio of such a layer is at most one half of a classical mono-layer array of contacting spheres, or approximately 0.26. While optimizing the combination of extraction of light trapped in the substrate and non-scattering of non-trapped light for the disclosed devices, such a material layer may not scatter light trapped in the organic and electrode layers, and is difficult to form. Moreover, as the amount of trapped light relative to the amount of emitted light increases, the relative amount of desirable scattering increases so that the described half-monolayer of scattering particles may not optimally extract all of the emitted light from LED devices of interest. It is also true that the organic electro-luminescent materials, reflective electrodes, and transparent electrodes all absorb some light. Hence, it can be desirable to scatter trapped high-angle light as soon as possible to minimize absorption. Additionally, experiments performed by applicant have shown that such volume ratios of a practical scattering layer does not extract light optimally for some LED device structures.

SUMMARY OF THE INVENTION

The present invention provides an electroluminescent (EL) device that includes a light-emitting area formed over a substrate. First and second electrodes and one or more EL unit(s) are included along with at least one light-emitting layer formed between the electrodes, wherein at least one electrode is transparent. A cover is located over the light-emitting area, and a light-scattering layer is located between the substrate and cover. The light-scattering layer includes transparent, light-scattering particles, wherein the ratio of the volume of light-scattering particles to the volume of the light-scattering layer is greater than 0.55 over a majority of the light-emitting area, wherein either the substrate or cover is transparent and transmits light emitted from the EL unit(s).

Another aspect of the present invention provides a method of forming an electroluminescent (EL) device that includes the following steps:

a) providing an LED with a light-emitting area comprising a first electrode and a second transparent electrode and one or more EL unit(s) formed between the electrodes;

b) forming a solution comprising an evaporable solvent and a plurality of transparent light-scattering particles;

c) coating the solution on a side of the transparent electrode opposite the one or more EL unit(s); and d) drying the solution to form a light-scattering layer on the transparent electrode, wherein the ratio of the volume of light-scattering particles to the volume of the light-scattering layer is greater than 0.55 over a majority of the light-emitting area.

ADVANTAGES

The present invention has the advantage that it increases the light output from an electroluminescent device.

BRIEF DESCRIPTION OF THE DRAWINGS

It will be understood that the figures are not to scale since the individual layers are too thin and the thickness differences of various layers too great to permit depiction to scale.

DETAILED DESCRIPTION OF THE INVENTION

Figure 1:
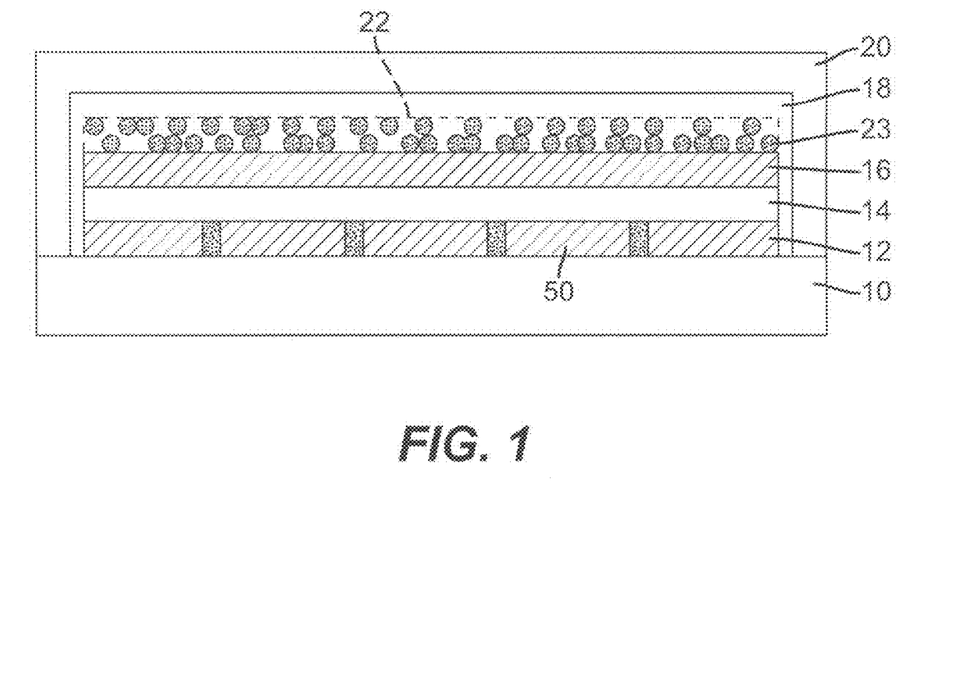
FIG. 1 is a cross section of an electroluminescent device having a light-scattering layer according to an embodiment of the present invention.

Referring to FIG. 1, in accordance with one embodiment of the present invention, an electroluminescent device comprises an LED having a first electrode 12, a second transparent electrode 16, one or more electroluminescent (EL) unit(s) 14 formed between the electrodes 12 and 16. Light-emitting areas of the device are defined where the first electrode 12, second transparent electrode 16, and the one or more EL unit(s) 14 are aligned. A light-scattering layer 22 is formed on a side of the transparent electrode 16 opposite the one or more EL unit(s) 14. The light-scattering layer 22 comprises transparent, light-scattering particles 23, wherein the ratio of the volume of light-scattering particles 23 to the volume of the light-scattering layer 22 is greater than 0.55 over a majority of the light-emitting area. Preferably, the ratio is between 0.55 and 0.75, and more preferably the ratio is between 0.55 and 0.65. The LED may be formed on a substrate 10 with a cover 20 adhered to the substrate forming a gap 18 between the LED and the inside of the cover 20.

Figure 10:
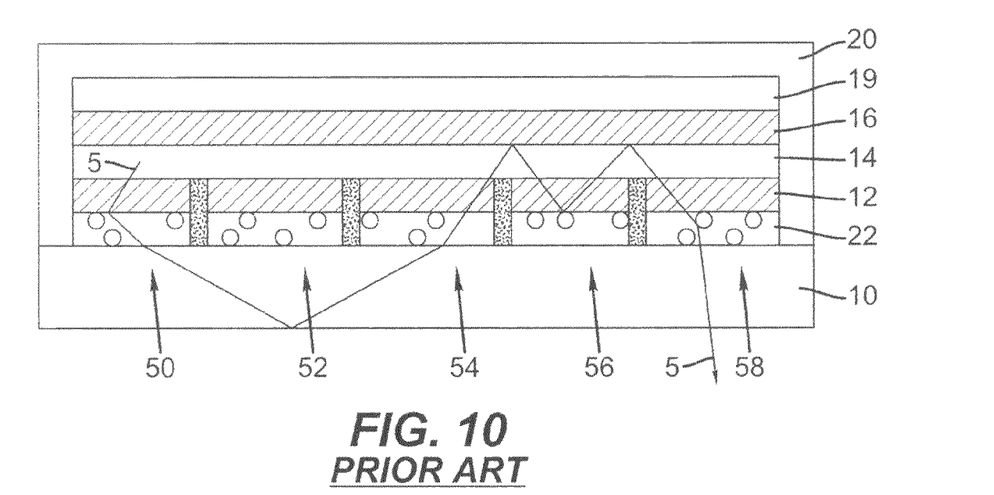
FIG. 10 is a cross section of an LED.

The EL unit 14 can be better understood from a close examination of FIG. 10. A typical LED 40 structure is shown to contain an electroluminescent (EL) unit 14 between a first electrode 12 and second electrode 16. The EL unit 14 as illustrated contains all layers (e.g. a light-emitting layer 33 and charge-control layers 35, 37) between the first electrode 12 and the second electrode 16, but not the electrodes 12 and 16 themselves. The light-emitting layer 33 can contain any material that emits light by the recombination of holes and electrons. In one embodiment, illustrated in FIG. 10, light-emitting layer 33 contains light-emitting quantum dots 39 in a semiconductor matrix 31. Quantum dots as used in this disclosure are light-emitting nano-particles. As illustrated in FIG. 10, the quantum dots can be spherical but are not limited to this shape. Light-emitting nano-particles can have any shape, including spheres, rods and wires, so long as they are inorganic crystalline nano-particles that have a length in at least one dimension of less than 100 nm. Preferably, the light-emitting nano-particles exhibit quantum confinement effects. Semiconductor matrix 31 can be an organic host material in the case of hybrid devices, or a polycrystalline inorganic semiconductor matrix in the case of inorganic quantum dot LEDs. EL unit 14 can optionally contain p-type or n-type charge-transport layers 35 and 37, respectively, in order to improve charge injection. EL unit 14 can have additional charge-transport layers, or contact layers (not shown). One typical LED device uses a glass substrate, a transparent conducting anode such as indium-tin-oxide (ITO), an EL unit 14 containing a stack of layers, and a reflective cathode layer. The layers in the EL unit 14 can be organic, inorganic, or a combination thereof.

In various embodiments of the present invention, the light-scattering particles 23 may have a relatively higher index of refraction than the average index of the remaining volume of the light-scattering layer 22. That is, the scattering particles 23 may be located in a relatively lower-index binder or formed on a surface (e.g. transparent electrode 16) in a vacuum or gas-filled cavity, such as cavity 18 of FIG. 1. In another embodiment of the present invention, the light-scattering particles 23 are non-spherical and randomly oriented. Such particle shapes and orientations effectively form a random scattering structure that scatters all light at every point on the surface of the transparent electrode 16, thereby increasing the amount of high-angle trapped light that may be scattered at each encounter with the light-scattering layer 22. Such a randomizing effect reduces angular dependence for color and luminance of the emitted light; a useful property for most light-emitting devices such as displays and area illuminators, but may not be found in prior-art sparse, low-volume ratio scattering layers. In further embodiments of the present invention, in order to minimize the amount of trapped light that cannot be extracted, no layers having an index of more than 0.1 less than that of the light-emitting layer and a thickness sufficient to trap light are formed between the light-scattering layer 22 and the EL unit(s) 14. Even more preferably, the light-scattering layer 22 is in direct optical contact with the EL unit(s) 14. By direct optical contact is meant that any layers formed between the light-scattering layer 22 and the EL unit(s) 14 have an index equal to or greater than that of the light-emitting material layer or a thickness insufficient to trap light. In either instance, transparent protective layers may be employed between the light-scattering layer 22 and the transparent electrode 16.

The volume of the layer is the volume enclosed by the surface below the light-scattering particles and on which the light-scattering particles are formed and in contact with and a parallel surface above, and in contact with, the light-scattering particles, and surfaces orthogonal to the top and bottom surfaces on each edge. For a device having a rigid, planar substrate, the volume is the volume of the smallest rectangular solid that can enclose all of the light-scattering particles in the layer.

The present invention may be employed in a pixellated display device having patterned electrodes and light-emitting areas 50. In such a device, the light-scattering layer 22 may be formed over each light-emitting area 50, either individually or in one contiguous coating. In either case, the volume of the light-scattering layer 22 encloses only those light-scattering particles 23 located above or below the light-emitting area 50. In accordance with the invention, the ratio of the volume of light-scattering particles 23 to the volume of the light-scattering layer 22 is greater than 0.55 over at least a majority of a light-emitting area. While the ratio may preferably be greater than 0.55 over the entire light-emitting area of the device, it may also be preferable to include relative large projecting particles not intended for light scattering in the light-scattering layer 22 over minor portions of the light emitting area (e.g., as spacer particles as taught in co-pending U.S. Ser. No. 11/179,409, filed Jul. 12, 2005, the disclosure of which is incorporated herein by reference). As such larger particles would otherwise dramatically increase the volume of a layer defined by the peaks of the projecting particles without significantly affecting the light scattering, areas including such relatively large particles need not be included when determining the volume ratio of scattering particles in the light-scattering layer 22 of the invention. Accordingly, the present invention only requires that the volume ratio be greater than 0.55 over a majority of a light-emitting area. Hence, any areas coated with such larger particles may be excluded from the delineation of the volume-defining surface of the light-scattering layer.

According to the present invention, the light-scattering particles 23 may comprise a variety of materials, as may the remainder of the volume not occupied by the light-scattering particles 23. In one embodiment of the present invention, the majority of the remaining volume may be a gas or vacuum. Preferably, air or an inert gas is employed.

The light-scattering particles 23 of the present invention preferably have an optical refractive index greater than or equal to the optical refractive index of the EL unit 14 and/or the transparent electrode 16. Such an optically refractive index effectively extracts light from the device since it may prevent any light from being trapped in the EL unit 14 and/or the transparent electrode 16. In practice, the light-scattering particles may have an optical refractive index greater than or equal to 1.8.

Figure 2:
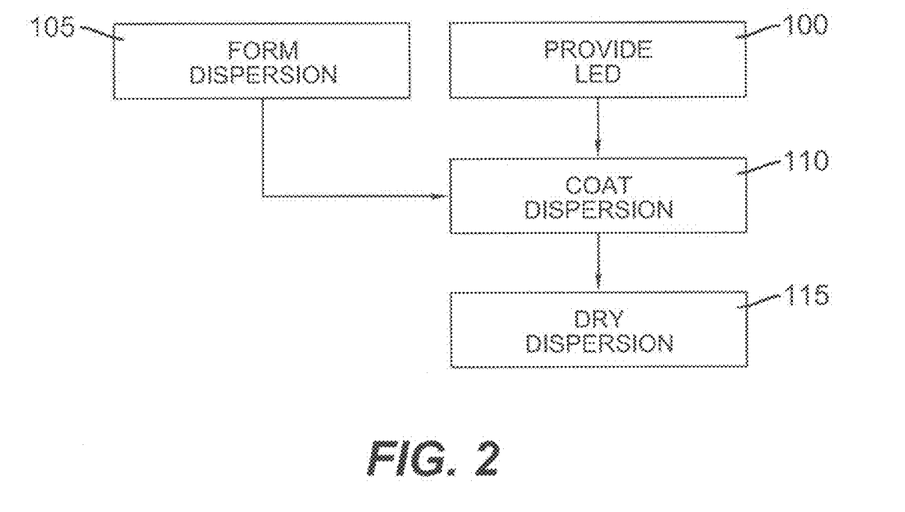
FIG. 2 is a flow diagram illustrating a method of making the present invention.

Referring to FIG. 2, in accordance with the present invention, the electroluminescent device incorporating a light-scattering layer 22 may be formed by providing 100 a LED with a light-emitting area comprising a first electrode and a second transparent electrode and one or more EL unit(s) formed between the electrodes; forming 105 a solution (for example, a dispersion) comprising an evaporable solvent and a plurality of transparent light scattering particles; coating 110 the solution on a side of the second transparent electrode opposite the one or more EL units; and drying 115 the solution to form a light-scattering layer on the transparent electrode, wherein the ratio of the volume of scattering particles to the volume of the layer is greater than 0.55 over at least a majority of a light-emitting area. Techniques for forming LED devices are well known in the art.

Figure 3:
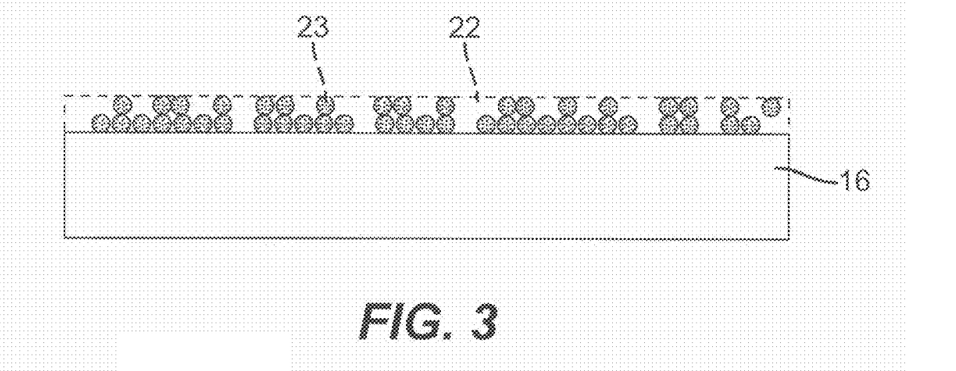
FIG. 3 is a cross section of a light-scattering layer according to an alternative embodiment of the present invention.

Additional materials may be included in the solution to further enhance the method or the effectiveness of the resulting layer. For example, surfactants or binders, may be employed. In particular, a binder having a refractive optical index less than the refractive index of the light-scattering particles and having a weight less than 10% of the weight of the light-scattering particles 23 may be employed. Such binders, for example comprising urethane, have been demonstrated by the Applicant to effectively act as both a surfactant and a means to adhere the light-scattering particles 23 to an electrode. Referring to FIG. 3, a dried layer 22 of light-scattering particles 23 are formed on the transparent electrode 16.

Figure 4:
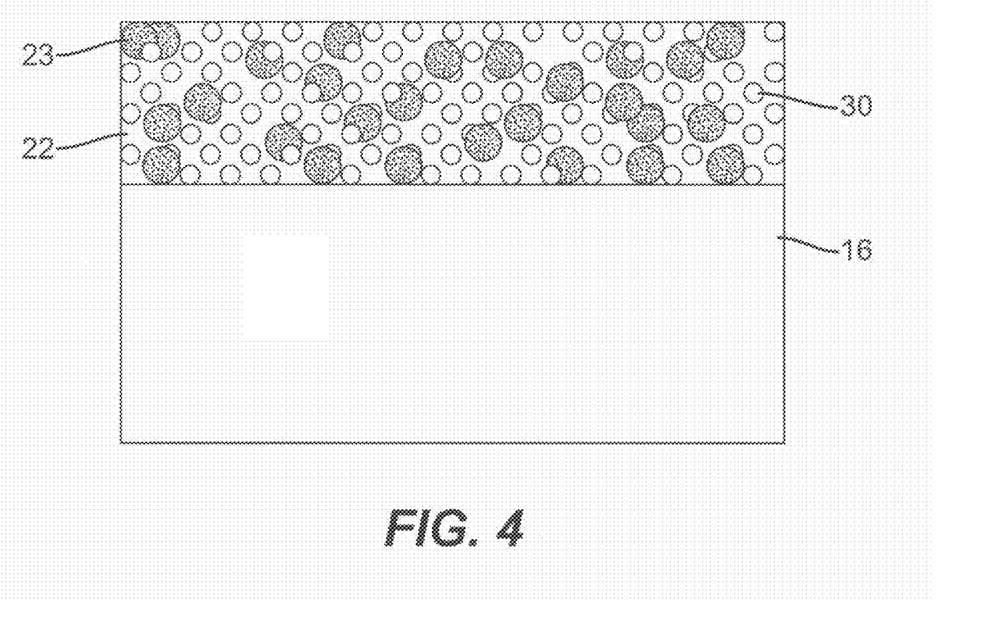
FIG. 4 is a cross section of a light-scattering layer according to an alternative embodiment of the present invention.

Referring to FIG. 4, in an alternative embodiment of the present invention, a binder may be added to a solution comprising light-scattering particles 23 and an admixture of transparent, high-index, nano-particles 30 to form a high-optical-index light-scattering layer 22 formed over transparent electrode 16. In this case, the binder and nano-particles 30 may form a smooth, planar layer adjacent to transparent electrode 16. Applicant has employed such high-index nano-particles 30 within a light-scattering layer 22 having light-scattering particles 23. The high-index nano-particles 30 may not scatter light but may enhance the optical coupling between the light-scattering particles 23 and the transparent electrode 16. The nano-particles 30 are likely to have an optical index different from that of the light-scattering particles 23.

Figure 5:
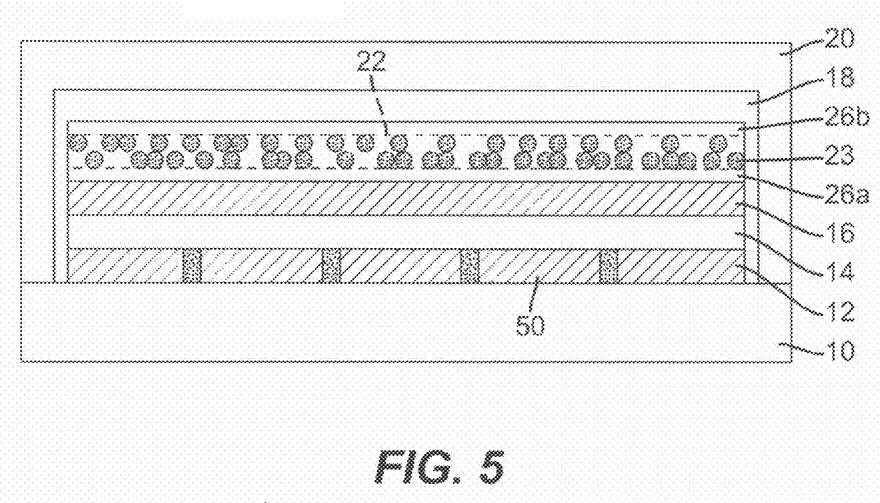
FIG. 5 is a cross section of an electroluminescent device having a light-scattering layer according to an alternative embodiment of the present invention.

As shown in FIG. 1, the light-scattering layer 22 may be adjacent to and in contact with the second transparent electrode 16. Such a configuration can place the light-scattering layer 22 in optical contact with the second transparent electrode 16, thereby, enhancing the transmission of light from the second transparent electrode 16 to the light-scattering layer 22. In further embodiments of the present invention, as shown in FIG. 5, one or more protective layers 26a/26b may be formed between the light-scattering layer 22 (26a) and the second transparent electrode 16 and/or over the light-scattering layer 22 (26b) on the side of the light-scattering layer 22 opposite the second transparent electrode 16. Protective layers, for example metal oxides such as aluminum oxide or zinc oxide and parylene, are known in the art. When employed, the index of such protective layers preferably may be greater than 0.1 less than that of the light-emitting material layer (more preferably at least that of the light-emitting material layer) and have a thickness insufficient to trap light emitted from the light emitting material layer. In a further embodiment of the present invention, a low-index layer, as taught in US 2006/0186802 may be employed in or as the gap 18 and the OLED device may be a top-emitting display device and the first electrode 12 may be a reflective electrode.

In other embodiments, the encapsulating cover 20 and substrate 10 may comprise glass or plastic with typical refractive indices of between 1.4 and 1.6. The transparent, low-index element 18 may comprise a solid layer of optically transparent material, a void, or a gap. Voids or gaps may be a vacuum or filled with an optically transparent gas or liquid material. For example air, nitrogen, helium, or argon all have a refractive index of between 1.0 and 1.1 and may be employed. Lower index solids which may be employed include fluorocarbon or MgF, each having indices less than 1.4. Any gas employed is preferably inert. Reflective electrode 12 is preferably made of metal (for example aluminum, silver, or magnesium) or metal alloys. Transparent electrode 16 is preferably made of transparent conductive materials, for example indium tin oxide (ITO) or other metal oxides. The EL unit(s) 14 may comprise organic materials known in the art, for example, hole-injection, hole-transport, light-emitting, electron-injection, and/or electron-transport layers. Such organic material layers are well known in the OLED art. The organic material layers typically have a refractive index of between 1.6 and 1.9, while indium tin oxide has a refractive index of approximately 1.8-2.1. Hence, the various layers 16 and 14 in the organic LED case have a refractive index range of 1.6 to 2.1. Alternatively, EL unit 14 may comprise inorganic semiconductor materials whose refractive index range is typically between 1.8 and 3.0. Of course, the refractive indices of various materials may be dependent on the wavelength of light passing through them, so the refractive index values cited here for these materials are only approximate. In any case, the transparent low-index element 18 preferably has a refractive index at least 0.1 lower than that of each of the first refractive index range and the second refractive index at the desired wavelength for the LED emitter.

The light-scattering particles 23 may comprise a metal oxide, for example titanium dioxide. In one embodiment, the light-scattering particles have an average maximum diameter of less than 2 microns and in an alternative embodiment, the light-scattering particles have an average maximum diameter of between one and two 2 microns. In an alternative embodiment, the light-scattering particles 23 may have an average maximum diameter of less than one micron. The light-scattering particles 23 themselves may be phosphorescent or fluorescent particles and serve to both extract trapped light, and to convert relatively high frequency light to a different, lower-frequency color. Relatively lower frequency light that is not converted may simply be extracted. In such a case, the phosphorescent or fluorescent light-scattering particles may be 0.5 to two microns in diameter.

Figure 6:
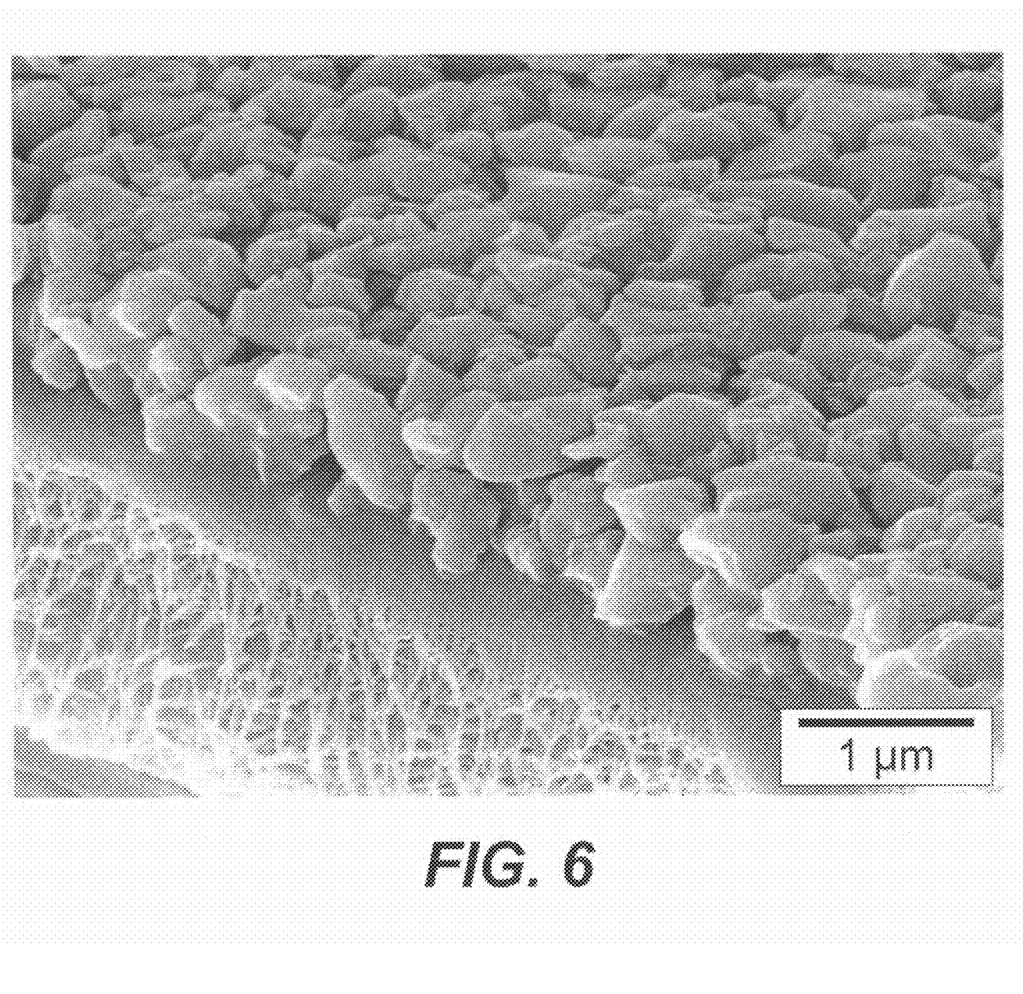
FIGS. 6 and 7 are photo-micrographs of a light-scattering layer according to an embodiment of the present invention.
Figure 7:
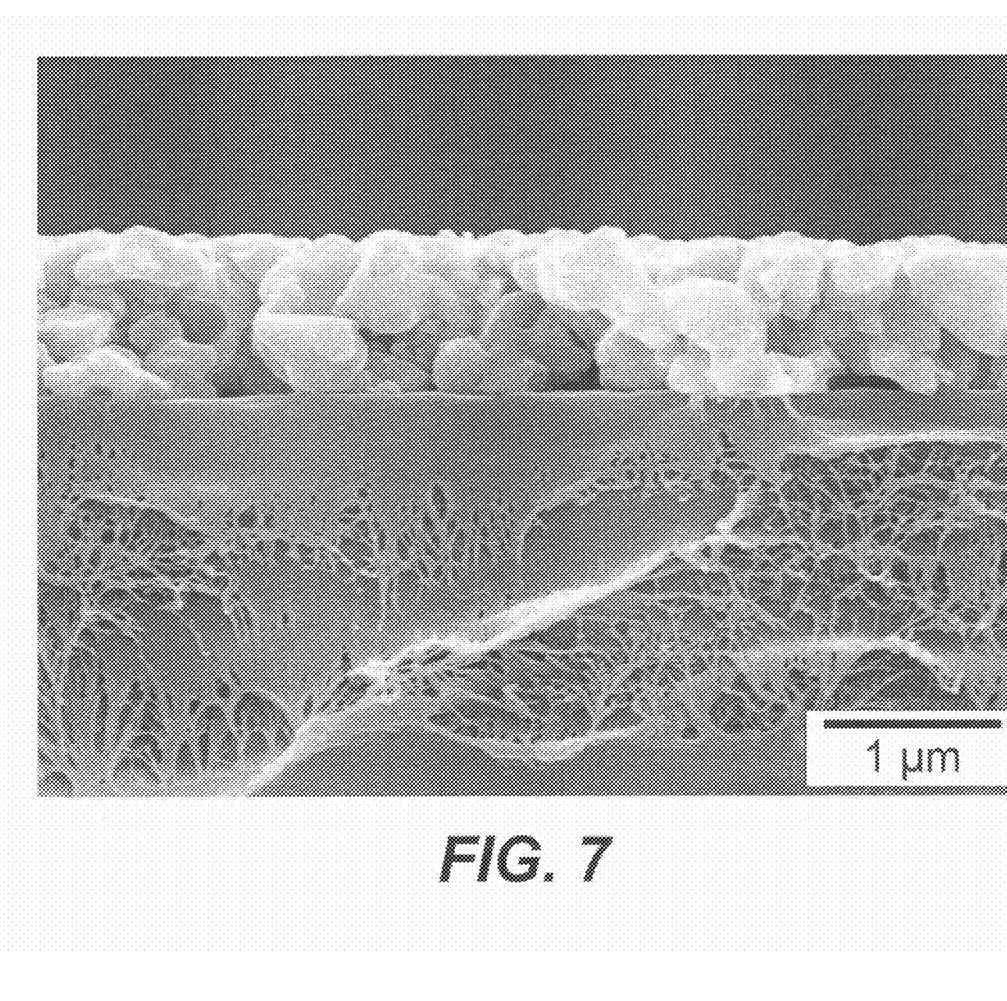

In operation, a current is provided by the electrodes 12 and 16 through the light-emitting layer 33 of EL unit 14 to emit light. Some of the light is usefully emitted through the scattering layer 22 out of the device. Other light may be trapped due to total internal reflection and the high optical indices of the transparent electrode 16 and the EL unit 14. This trapped light may interact with the light-scattering particles 23 in the light-scattering layer 22 and be usefully redirected out of the device, thereby increasing the brightness of the device. Applicants have constructed such a device. FIGS. 6 and 7 are a photomicrograph of a light-scattering layer having $TiO_2$ light-scattering particles according to an embodiment of the present invention having a volume ratio of approximately 0.6. The light-scattering layer comprises 0.5-2 micron $TiO_2$ particles with a 10% by weight resin surfactant and binder (Solsperse 2000 manufactured by Avecia) and has a thickness of less than one micron. The layer was coated from xylene dispersion in a concentration of 14% by weight, deposited by inkjet employing 60 pL drops deposited at 100 drops/s at a 70 micrometer spacing on the surface of a top-emitting OLED device to form a thin wet film, which was dried at 50 C. Other solvents, including toluene, and coating methods, such as spin coating and spray coating, may alternatively be employed, along with drying temperature variation, to provide a different drying rates. Different densities of particles in solvent were also deposited at different rates and then dried at different temperatures (either in a controlled temperature atmosphere or by heating the substrate on which the dispersion is deposited), thus providing variable drying rates for given quantities of light-scattering materials. In particular, the drying can be controlled to provide different densities of the final light-scattering layers. Applicants demonstrated that temperatures outside a preferred range of from 40-60 C typically resulted in sub-optimal packing densities of less than 0.55 volume percent and did not optimally extract light from the OLED device. Moreover, the rate of deposition (for example, drops per second from an inkjet deposition system) for a constant volume of scattering particles in a dispersion over a surface area affects the drying and the packing structure of the dried layer. The light-scattering layer having the preferred volume ratio was provided over the transparent electrode of an OLED device and the performance of the light-scattering layer was found to have the desired performance.

The scattering layer 22 can employ a variety of materials. For example, randomly located spheres of titanium dioxide may be employed in a matrix of polymeric material. Alternatively, a more structured arrangement employing ITO, silicon oxides, or silicon nitrides may be used. Shapes of refractive elements may be cylindrical, rectangular, rutile, or spherical, but it is understood that the shape is not limited thereto. The difference in refractive indices between materials in the scattering layer 22 may be, for example, from 0.3 to 3, and a large difference is generally desired. The thickness of the scattering layer, or size of features in, or on the surface of, a scattering layer may be, for example, 0.03 to 50 µm although a thickness of less than one micron may be preferred to minimize absorption and maximize compatibility with other elements of a display device. It is generally preferred to avoid diffractive effects in the scattering layer. Such effects may be avoided, for example, by locating features randomly or by ensuring that the sizes, shapes or distribution of the refractive elements vary and/or are not the same as the wavelength of the color of light emitted by the device from the light-emitting area.

Materials of the light scattering layer 22 can include organic materials (for example polymers or electrically conductive polymers) or inorganic materials. The organic materials may include, e.g., one or more of polythiophene, PEDOT, PET, or PEN. The inorganic materials may include, e.g., one or more of $SiO_x$ (x>1), $SiN_x$ (x>1), $Si_3N_4$, $TiO_2$, MgO, ZnO, $Al_2O_3$, $SnO_2$, $In_2O_3$, $MgF_2$, hafnia ($HfO_2$), zirconia ($ZrO_2$), zircon ($ZrO_2.SiO_2$), gadolinium gallium garnet ($Gd_3Ga_5O_{12}$), barium sulfate, yttria ($Y_2O_3$), yttrium aluminum garnet ("YAG", $Y_3Al_5O_{12}$) calcite ($CaCO_3$), sapphire ($Al_2O_3$), diamond, magnesium oxide, and/or germanium oxide, and $CaF_2$. The scattering layer 22 may comprise, for example, silicon oxides and silicon nitrides having a refractive index of 1.6 to 1.8 and doped with titanium dioxide having a refractive index of 2.5 to 3. Polymeric materials having refractive indices in the range of 1.4 to 1.6 may be employed having a dispersion of refractive elements of material with a higher refractive index, for example titanium dioxide.

Conventional lithographic means can be used to create the scattering layer using, for example, photo-resist, mask exposures, and etching as known in the art. Alternatively, solution coating may be employed in which a liquid, for example a solvent having a dispersion of titanium dioxide, may form a scattering layer 22.

Most organic and hybrid organic-inorganic LED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation.

In particular, as illustrated in FIG. 5, protective layers 26a/26b may be employed. For example, very thin layers of transparent encapsulating materials may be deposited on the electrode 16. In this case, the scattering layer 22 may be deposited over the layers of protective materials 26a. This structure has the advantage of protecting the electrode 16 during the deposition of the scattering layer 22. Preferably, the layers of transparent protective material 26a has a refractive index at least comparable to the refractive index range of the transparent electrode and organic layers, or is very thin (e.g., less than about 0.2 micron) so that waveguided light in the transparent electrode 16 and EL unit(s) 14 will pass through the layers of transparent protective material 26a and be scattered by the scattering layer 22.

Electroluminescent devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may also be practiced with either active- or passive-matrix OLED devices. It may also be employed in display devices or in area illumination devices. In a one embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. In another embodiment, the present invention is employed in a flat panel inorganic LED device containing quantum dots as disclosed in, but not limited to U.S. Patent Application Publication No, 2007/0057263 entitled "Quantum dot light emitting layer" and pending U.S. application Ser. No. 11/683,479, by Kahen, which are both hereby incorporated by reference in their entirety. Many combinations and variations of organic, inorganic and hybrid light-emitting displays can be used to fabricate such a device, including both active- and passive-matrix LED displays having either a top- or bottom-emitter architecture. Many combinations and variations of electroluminescent devices can be used to fabricate such a display, including both active- and passive-matrix LED displays having either a top- or bottom-emitter architecture.

The invention has been described in detail with particular reference to certain preferred embodiments thereof, but it will be understood that variations and modifications can be effected within the spirit and scope of the invention.

PARTS LIST 1, 2, 3, 4 light rays
10 substrate
12 electrode
14 EL unit(s)
16 transparent electrode
18 gap
19 gap
20 cover
22 scattering layer
23 scattering particles 26, 26a, 26b protective layer
30 transparent, high-index particles
31 semiconductor matrix
33 light emitting layer
35, 37 charge-transport layers
39 quantum dot
40 LED
50 light-emitting area
100 provide OLED step
105 form dispersion step
110 coat dispersion step
115 dry dispersion step

The invention claimed is:

1. An electroluminescent (EL) device, comprising:
a substrate;
a light-emitting area formed over the substrate and comprising first and second electrodes and one or more EL unit(s) comprising at least one light-emitting layer formed between the electrodes, wherein at least one electrode comprises a transparent electrode;
a cover located over the light-emitting area; and
a light-scattering layer located between the substrate and cover, comprising transparent, light-scattering particles wherein the ratio of the volume of the transparent, light-scattering particles to the volume of the light-scattering layer is greater than 0.55 over the light-emitting area, wherein either the substrate or cover is transparent and transmits light emitted from the EL unit(s),
wherein all the transparent, light-scattering particles in the light-scattering layer have a diameter of 0.5 to 2 microns.

2. The electroluminescent (EL) device of claim 1, wherein the light-scattering layer is located between the substrate and one of the first and second electrodes or between an electrode and the EL unit(s), or between an electrode and the cover.

3. The electroluminescent (EL) device of claim 1, wherein the light-scattering layer is adjacent to and in contact with one of the first and second electrodes.

4. The electroluminescent (EL) device of claim 1, wherein the first electrode is formed over, and adjacent to, the substrate and is reflective, and the second electrode is formed over the EL unit(s) and is transparent, and the light-scattering layer is located over the transparent second electrode on a side of the transparent electrode opposite the first reflective electrode.

5. The electroluminescent (EL) device of claim 1, wherein the first electrode is formed over the substrate and is transparent, and the second electrode is formed over the EL unit(s) and is transparent, and the light-scattering layer is between the first transparent electrode and the substrate.

6. The electroluminescent (EL) device of claim 1, wherein at least one of the first and second electrodes includes multiple layers having a transparent layer and a reflective layer, and wherein the light-scattering layer is formed between the transparent layer and the reflective layer.

7. The electroluminescent (EL) device of claim 1, wherein the light-scattering particles are non-spherical and randomly oriented.

8. The electroluminescent (EL) device of claim 1, wherein the majority of the light-scattering layer volume that is not occupied by light-scattering particles is occupied by a gas or vacuum.

9. The electroluminescent (EL) device of claim 1, wherein the light-scattering layer further comprises a binder having a refractive optical index less than the refractive index of the light-scattering particles and having a weight less than 10% of the weight of the light-scattering particles.

10. The electroluminescent (EL) device of claim 1, wherein the ratio of the volume of light-scattering particles to the volume of the light-scattering layer is between 0.55 and 0.75.

11. The electroluminescent (EL) device of claim 1, further comprising one or more protective layers formed between the light-scattering layer and the transparent electrode or over the light-scattering layer on the side of the light-scattering layer opposite the transparent electrode, or both between the light-scattering layer and the transparent electrode, and over the light-scattering layer on the side of the light-scattering layer opposite the transparent electrode.

12. The electroluminescent (EL) device of claim 1, wherein the light-scattering particles comprise a metal oxide or metal nitride.

13. The electroluminescent (EL) device of claim 1, wherein the light-scattering layer is less than one micrometer thick.

14. A method of forming an electroluminescent (EL) device comprising the steps of:
a) providing an LED with a light-emitting area comprising a first electrode and a second transparent electrode and one or more EL unit(s) formed between the electrodes;
b) forming a solution comprising an evaporable solvent and a plurality of transparent, light-scattering particles wherein all the transparent light-scattering particles in the light-scattering layer have a diameter of 0.5 to 2 microns;
c) coating the solution on a side of the transparent electrode opposite the one or more EL unit(s); and
d) drying the solution to form a light-scattering layer on the transparent electrode, wherein the ratio of the volume of the transparent, light-scattering particles to the volume of the light-scattering layer is greater than 0.55 over the light-emitting area.

15. An electroluminescent (EL) device, comprising:
a substrate;
a light-emitting area formed over the substrate and comprising first and second electrodes and one or more EL unit(s) comprising at least one light-emitting layer formed between the electrodes, wherein at least one electrode comprises a transparent electrode, the transparent electrode and EL unit(s) material having a first refractive index range;
a cover located over the light-emitting area having a second refractive index and through which light from the EL unit(s) is emitted;
a light-scattering layer located between the substrate and cover, comprising transparent, light-scattering particles, wherein all the transparent, light-scattering particles in the light-scattering layer have a diameter of 0.5 to 2 microns, and wherein the ratio of the volume of the transparent, light-scattering particles to the volume of the light-scattering layer is greater than 0.55 over the light-emitting area, wherein either the substrate or cover is transparent and transmits light emitted from the EL unit(s); and
a transparent low-index element having a third refractive index lower than each of the first refractive index range and second refractive index and located between the light-scattering layer and the transparent substrate or cover.

16. The electroluminescent (EL) device of claim 15, wherein the cover is a transparent cover and wherein the transparent low-index element is adjacent to and in contact with the transparent cover or wherein the substrate is a transparent substrate and wherein the transparent low-index element is adjacent to and in contact with the transparent substrate.

17. The electroluminescent (EL) device of claim 15, wherein the first electrode is transparent and is formed over the substrate, and the second electrode is reflective and is formed over the one or more EL unit(s), and the light-scattering layer is located over the transparent low-index element and adjacent to and in contact with the first transparent electrode.

* * * * *